United States Patent
Chen et al.

(10) Patent No.: US 9,224,466 B1
(45) Date of Patent: Dec. 29, 2015

(54) DUAL CAPACITOR SENSE AMPLIFIER AND METHODS THEREFOR

(71) Applicant: SanDisk 3D LLC, Milpitas, CA (US)

(72) Inventors: Yingchang Chen, Cupertino, CA (US); Anurag Nigam, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/499,717

(22) Filed: Sep. 29, 2014

(51) Int. Cl.
*G11C 7/02* (2006.01)
*G11C 13/00* (2006.01)
*G11C 7/06* (2006.01)

(52) U.S. Cl.
CPC .............. *G11C 13/004* (2013.01); *G11C 7/062* (2013.01); *G11C 7/065* (2013.01)

(58) Field of Classification Search
CPC .... G11C 7/12; G11C 11/404; G11C 11/4091; G11C 7/06; G11C 7/062; G11C 7/065

USPC ...................... 365/148, 149, 207, 205, 189.07
See application file for complete search history.

(56) References Cited

U.S. PATENT DOCUMENTS 6,803,794 B2 * 10/2004 Martin ............... G01R 27/2605
327/52

* cited by examiner

*Primary Examiner* — David Lam
(74) *Attorney, Agent, or Firm* — Vierra Magen Marcus LLP

(57) ABSTRACT

Methods and apparatus are provided for reading a selected memory cell of a memory array using a sense amplifier that includes a first capacitor and a second capacitor. The selected memory cell is coupled to a bit line and a selected word line. A first noise voltage is generated on the first capacitor, and a selected memory cell voltage and a second noise voltage are generated on the second capacitor. The first noise voltage is an estimate of the second noise voltage. An output signal value is generated proportional to a difference between the selected memory cell voltage and a reference voltage, and a difference between the first noise voltage and second noise voltage. The output signal value is used to determine a data value for the selected memory cell.

21 Claims, 20 Drawing Sheets

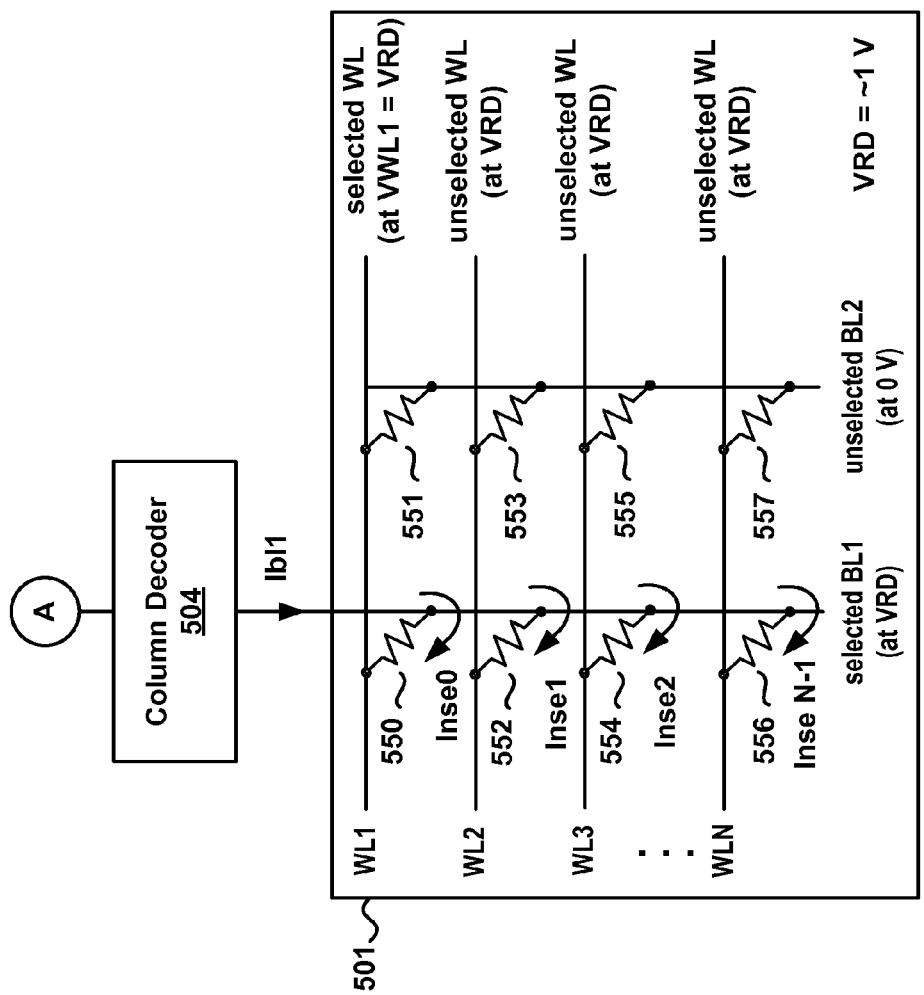
FIG. 6B1

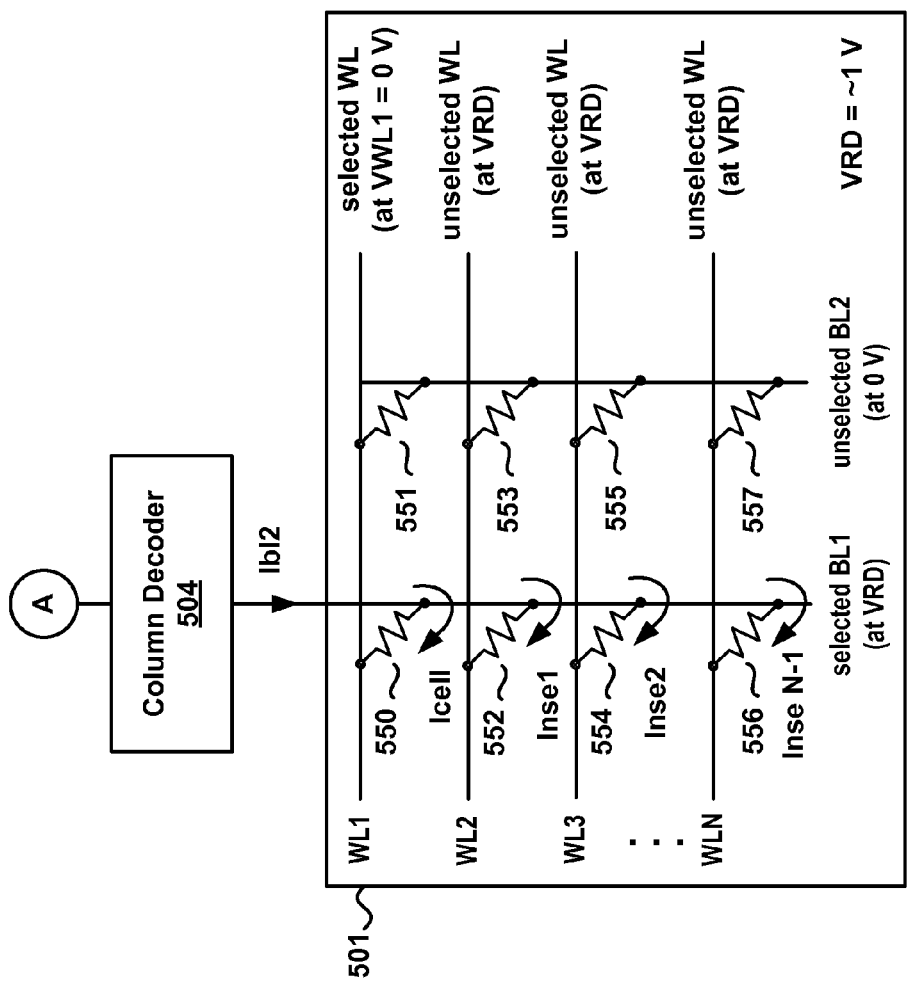
FIG. 6B2

US 9,224,466 B1

DUAL CAPACITOR SENSE AMPLIFIER AND METHODS THEREFOR

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics, reduced memory cell sensing currents, and increased bit line settling times.

BRIEF DESCRIPTION OF THE DRAWINGS

FIGS. 6B1-6B2 depict portions of a memory array coupled to the sense amplifier of FIG. 6A.

DETAILED DESCRIPTION

Figure 1A:
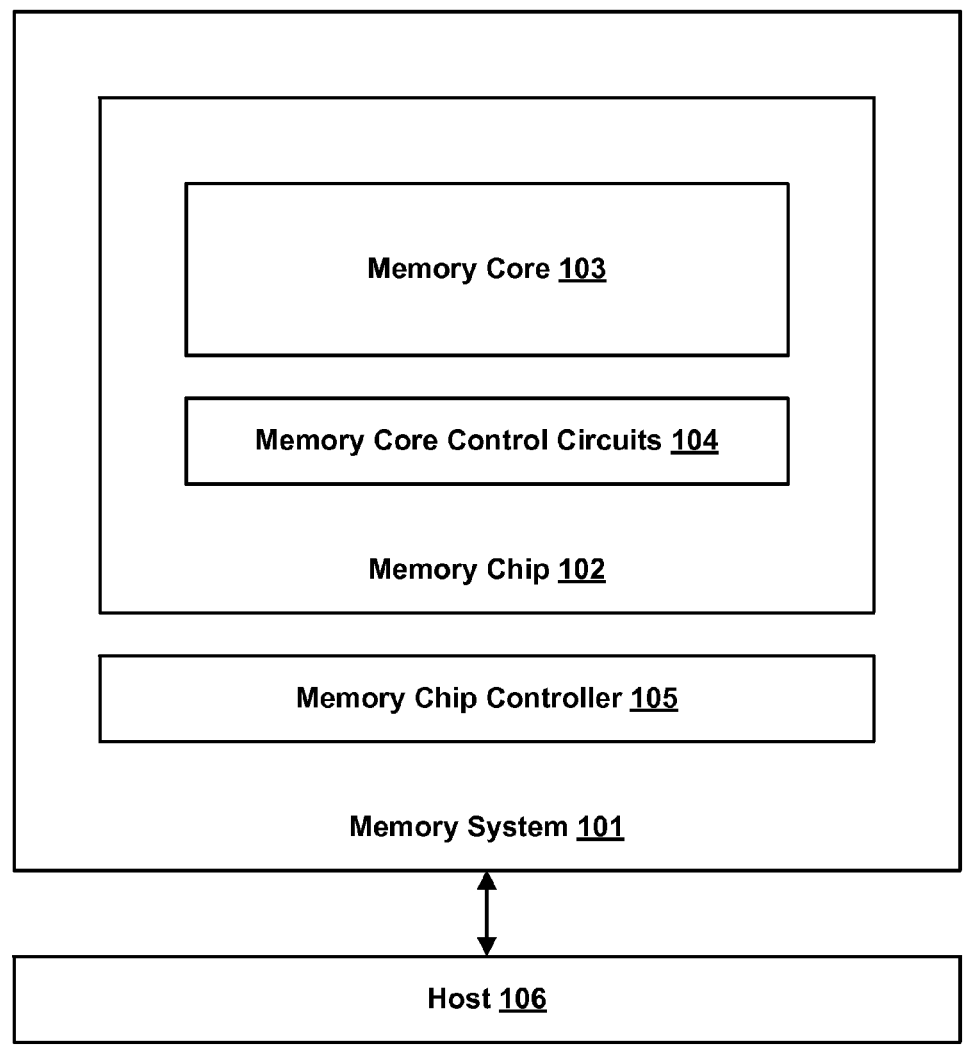
FIG. 1A depicts an embodiment of a memory system and a host.

Technology is described for a dual capacitor sense amplifier. In particular, technology is described for reading a selected memory cell of a memory array using a sense amplifier that includes a first capacitor and a second capacitor. The selected memory cell is coupled to a bit line and a selected word line. The memory array includes a group of unselected memory cells that are each coupled to the bit line and a corresponding one of a group of unselected word lines. A first noise voltage is generated on the first capacitor, and a selected memory cell voltage and a second noise voltage are generated on the second capacitor. The first noise voltage is an estimate of the second noise voltage. An output signal value is generated proportional to a difference between the selected memory cell voltage and a reference voltage, and a difference between the first noise voltage and second noise voltage The output signal value is used to determine a data value for the selected memory cell.

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells).

The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may include a non-volatile storage system interfacing with the host (e.g., a mobile computing device). In some cases, the memory system 101 may be embedded within the host 106. In other cases, the memory system 101 may include a memory card. As depicted, the memory system 101 includes a memory chip controller 105 and a memory chip 102. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit. In other embodiments, memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array. The one or more managing or control circuits may provide control signals to a memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
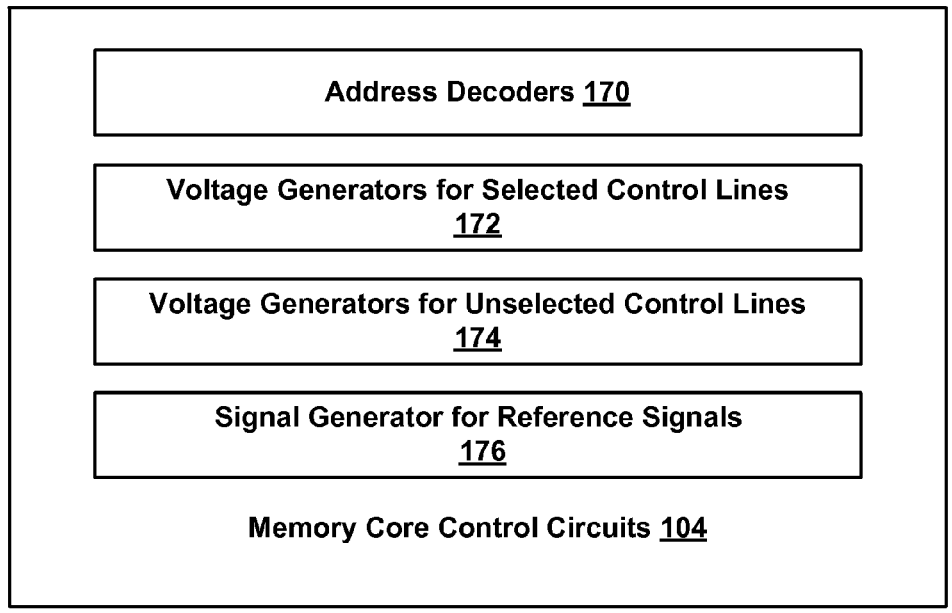
FIG. 1B depicts an embodiment of memory core control circuits.

FIG. 1B depicts one embodiment of memory core control circuits 104. As depicted, the memory core control circuits 104 include address decoders 170, voltage generators for selected control lines 172, voltage generators for unselected control lines 174 and signal generators for reference signals 176 (described in more detail below). Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may include one or more voltage generators for generating selected control line voltages. The voltage generators for unselected control lines 174 may include one or more voltage generators for generating unselected control line voltages. The signal generators for reference signals 176 may include one or more voltage or current generators for generating reference voltage or current signals. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings can also be used with the technology described herein.

Figure 1C:
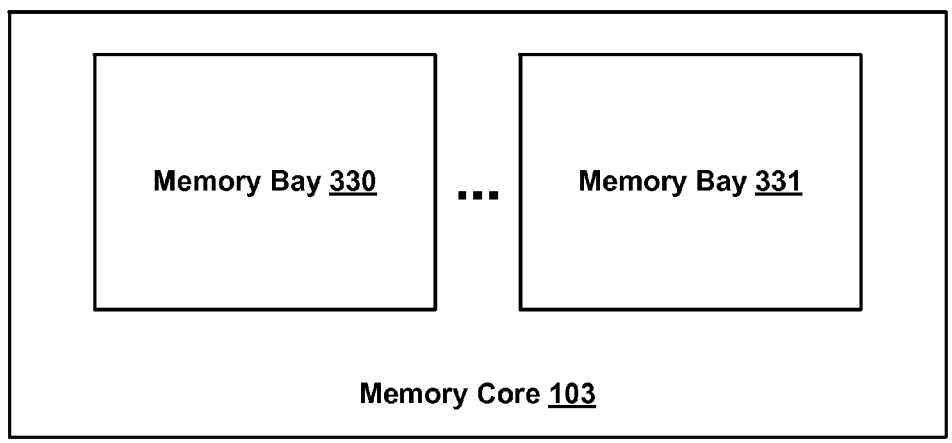
FIG. 1C depicts an embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
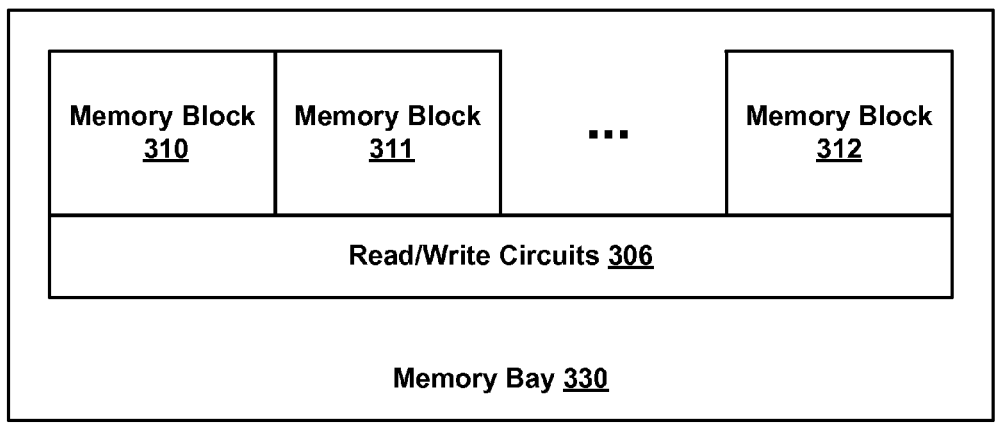
FIG. 1D depicts an embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address and/or to acquire overhead information (e.g., ECC information) before performing a write operation to write the set of data to the target address.

In some cases, read/write circuits 306 may be used to program a particular memory cell to be in one of three or more data/resistance states (i.e., the particular memory cell may include a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
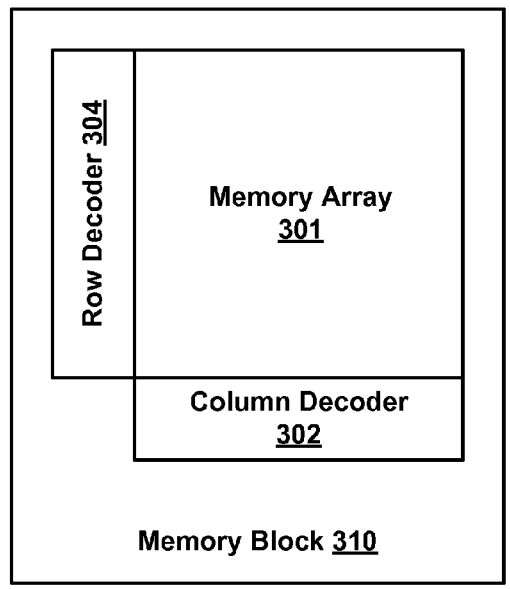
FIG. 1E depicts an embodiment of a memory block.

FIG. 1E depicts one embodiment of memory block 310 in FIG. 1D. As depicted, memory block 310 includes a memory array 301, row decoder 304, and column decoder 302. Memory array 301 may include a contiguous group of memory cells having contiguous word lines and bit lines. Memory array 301 may include one or more layers of memory cells. Memory array 301 may include a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
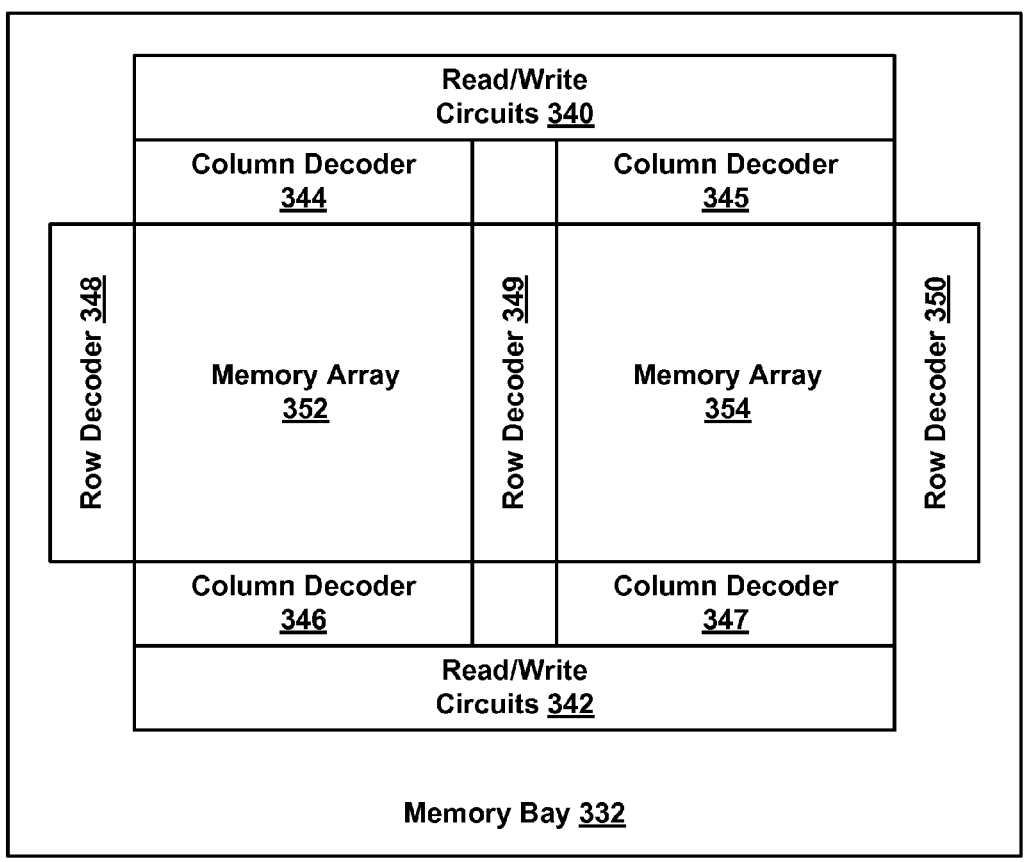
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2A:
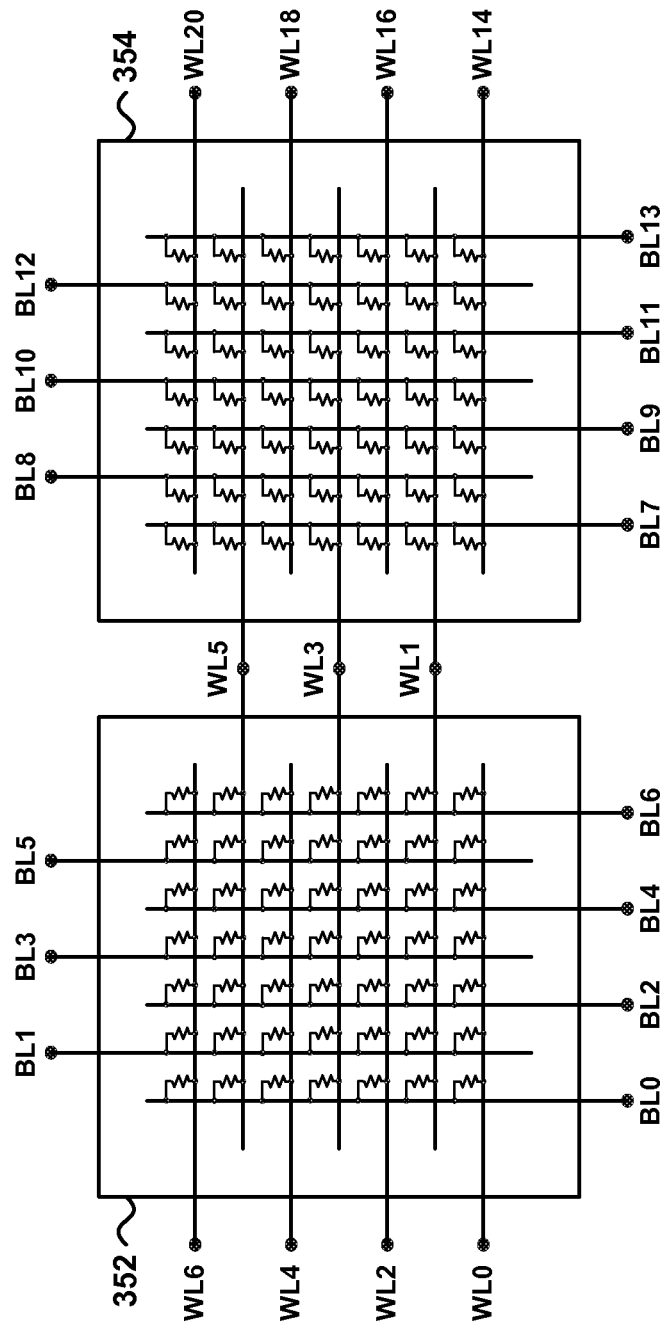
FIG. 2A depicts a schematic diagram of the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may include memory layers that are oriented in a horizontal plane that is horizontal to the supporting substrate. In another embodiment, the memory arrays 352 and 354 may include memory layers that are oriented in a vertical plane that is vertical with respect to the supporting substrate (i.e., the vertical plane is perpendicular to the supporting substrate).

Figure 2B:
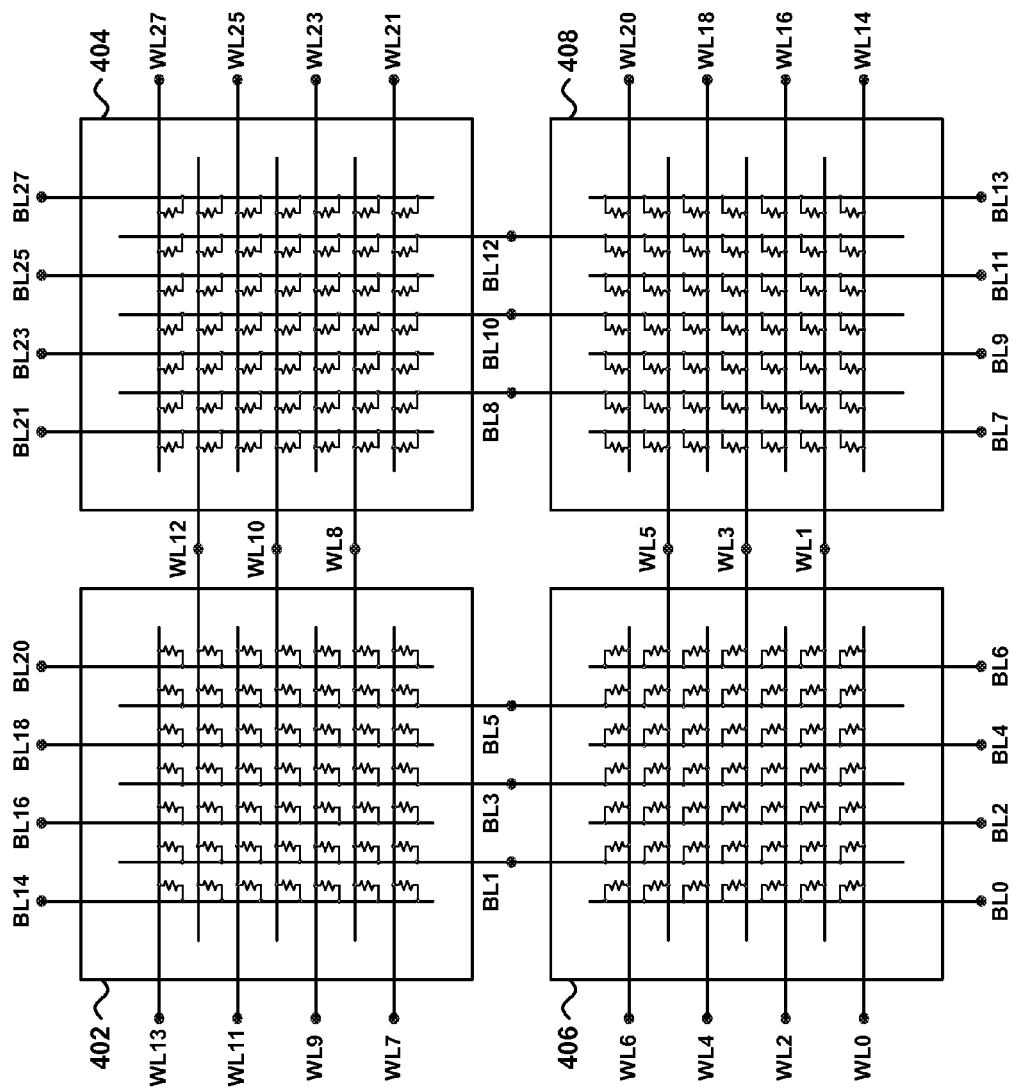
FIG. 2B depicts a schematic diagram of a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
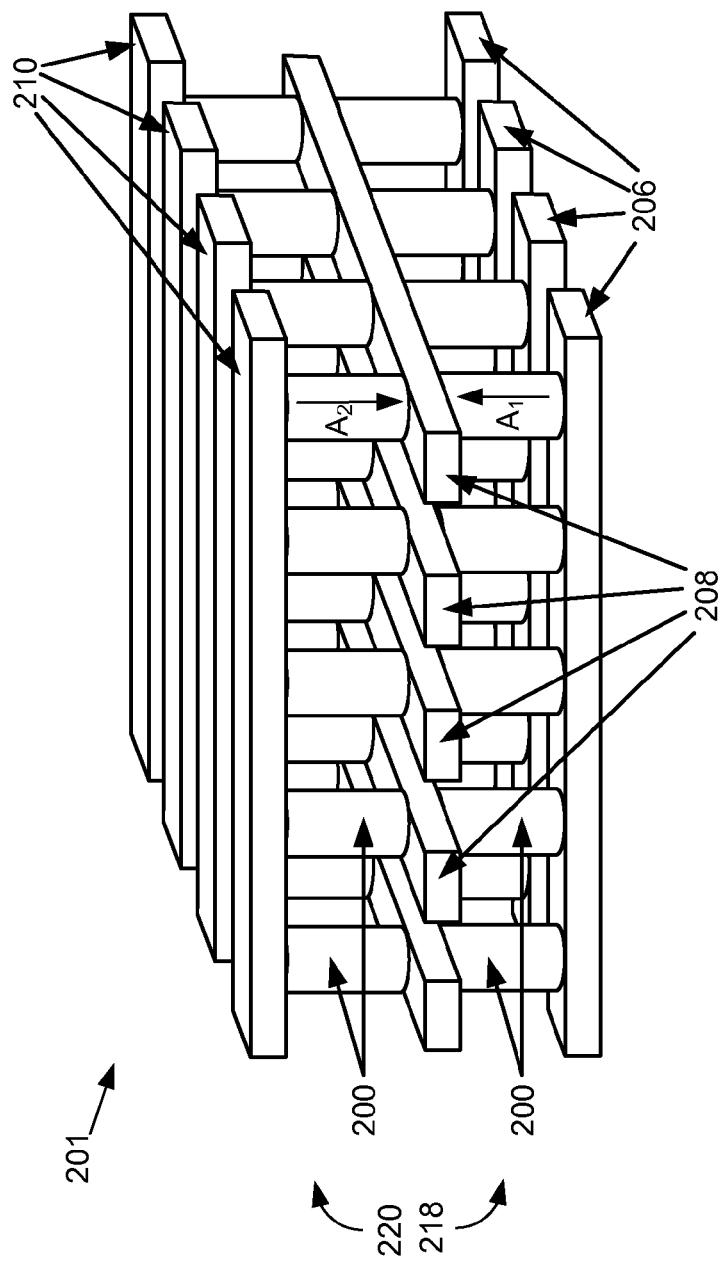
FIG. 3A depicts an embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode (or other steering element) from a memory cell may reduce the process complexity and costs associated with manufacturing a memory array.

In one embodiment, the memory cells 200 of FIG. 3A include re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may include resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to include more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0" and the low-resistivity state may be associated with binary data "1." In other embodiments, SETTING and RESETTING operations and/or the data encoding can be reversed. In some embodiments, the first time a resistance-switching element is SET may require a higher than normal programming voltage and may be referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
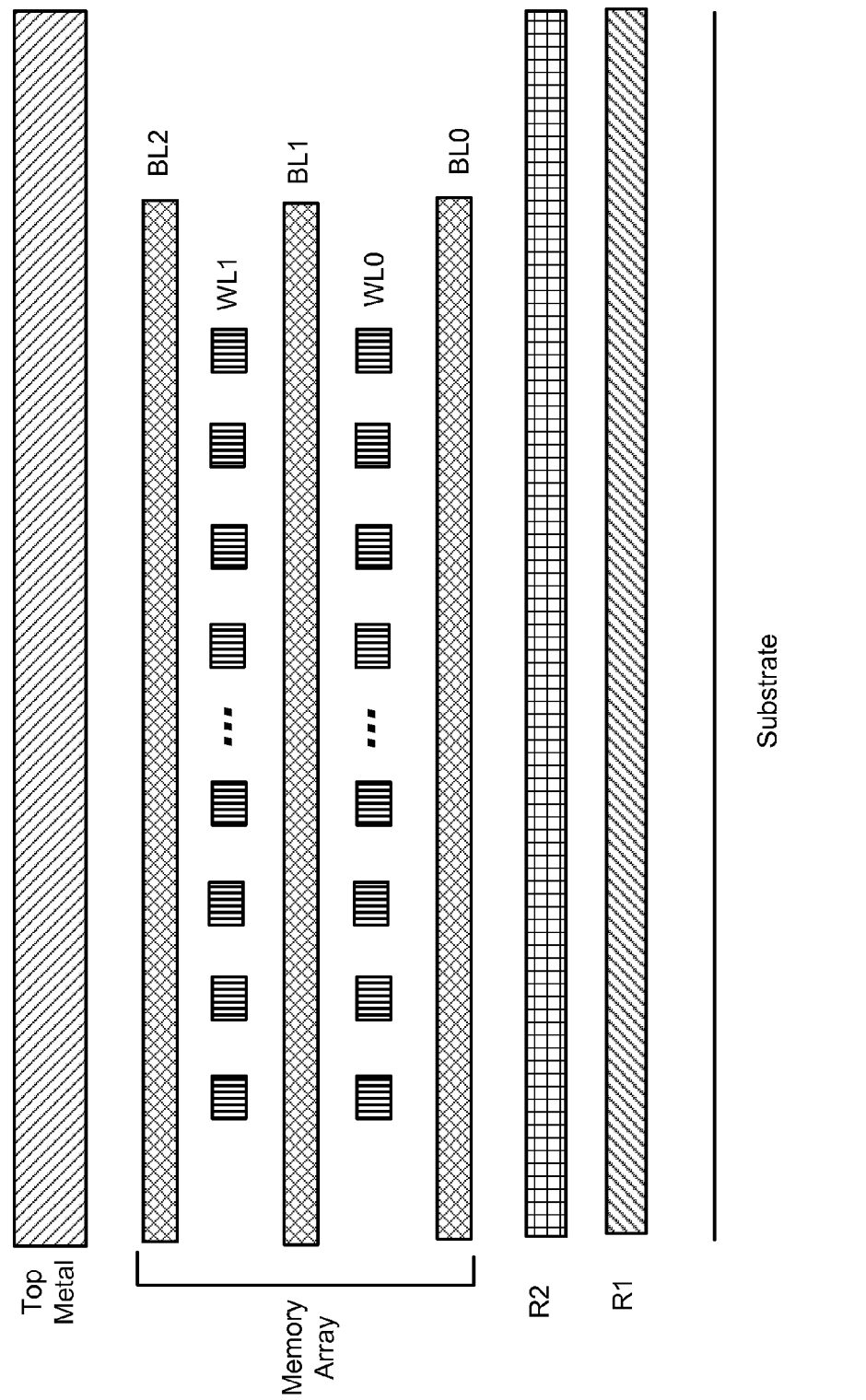
FIG. 3B depicts a subset of the memory array and routing layers of an embodiment of a three-dimensional memory array.

FIG. 3B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3C:
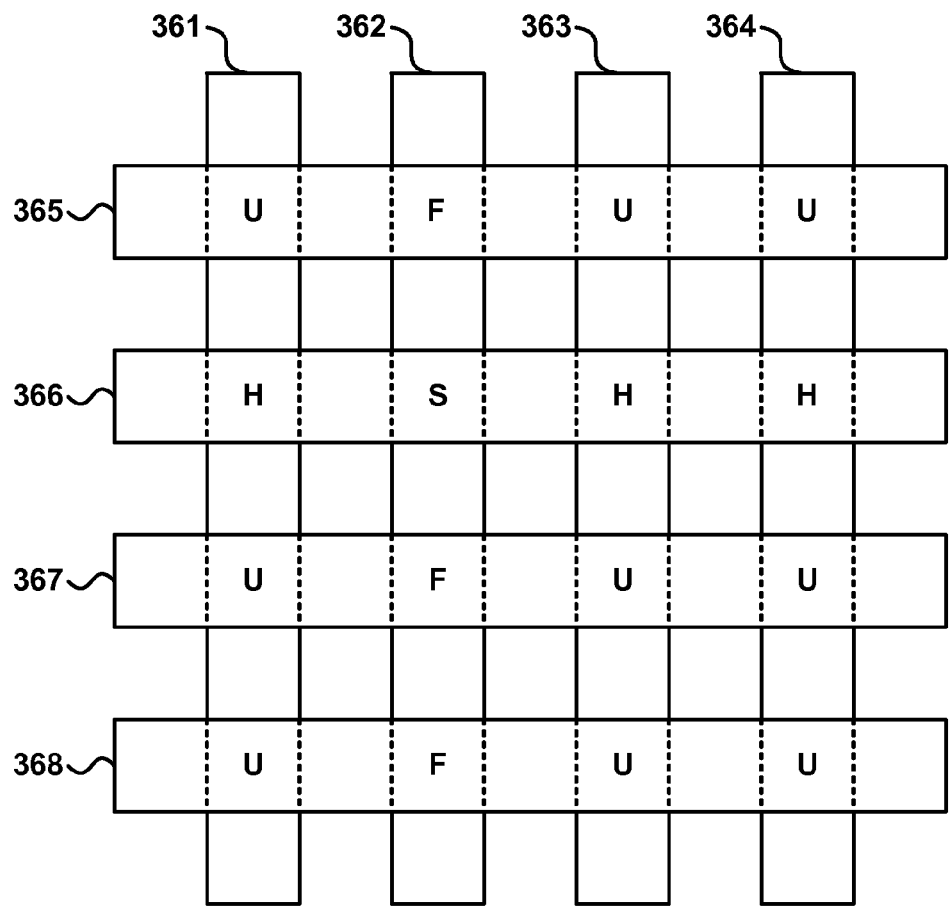
FIGS. 3C-3D depicts various embodiments of a cross-point memory array.

FIG. 3C depicts one embodiment of a cross-point memory array 360. The cross-point memory array 360 may correspond with memory array 201 in FIG. 3A. As depicted, cross-point memory array 360 includes word lines 365-368 and bit lines 361-364. Word line 366 includes a selected word line and bit line 362 includes a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 include unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 include unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 include unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3D:
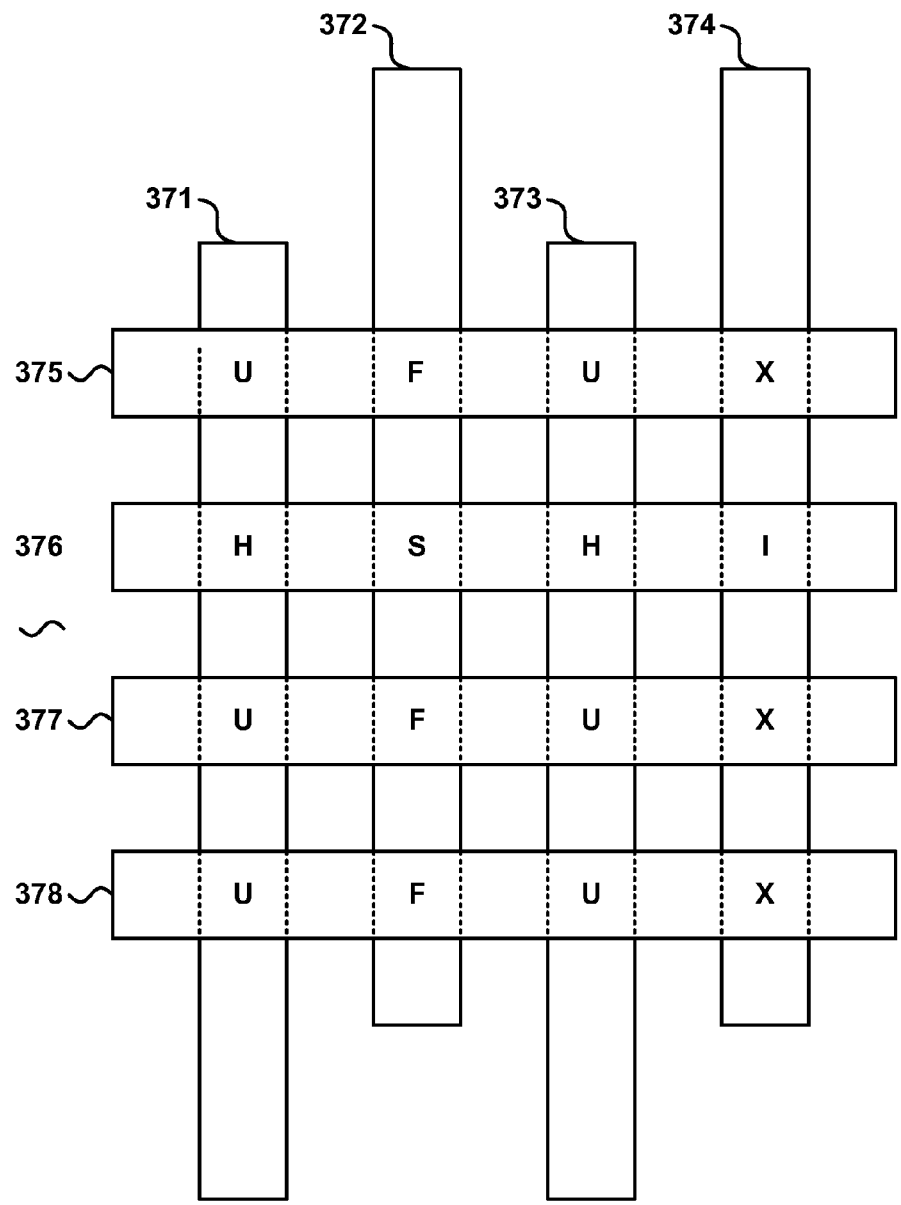

FIG. 3D depicts an alternative embodiment of a cross-point memory array 370. Cross-point memory array 370 may correspond with memory array 201 in FIG. 3A. As depicted, cross-point memory array 370 includes word lines 375-378 and bit lines 371-374. Word line 376 includes a selected word line and bit lines 372 and 374 include selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 include unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may include H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of cross-point memory array 370 may include resistive memory elements without isolating diodes. In one embodiment, the bit lines 372 and 373 may include vertical bit lines in a three dimensional memory array comprising comb shaped word lines.

Figure 4A:
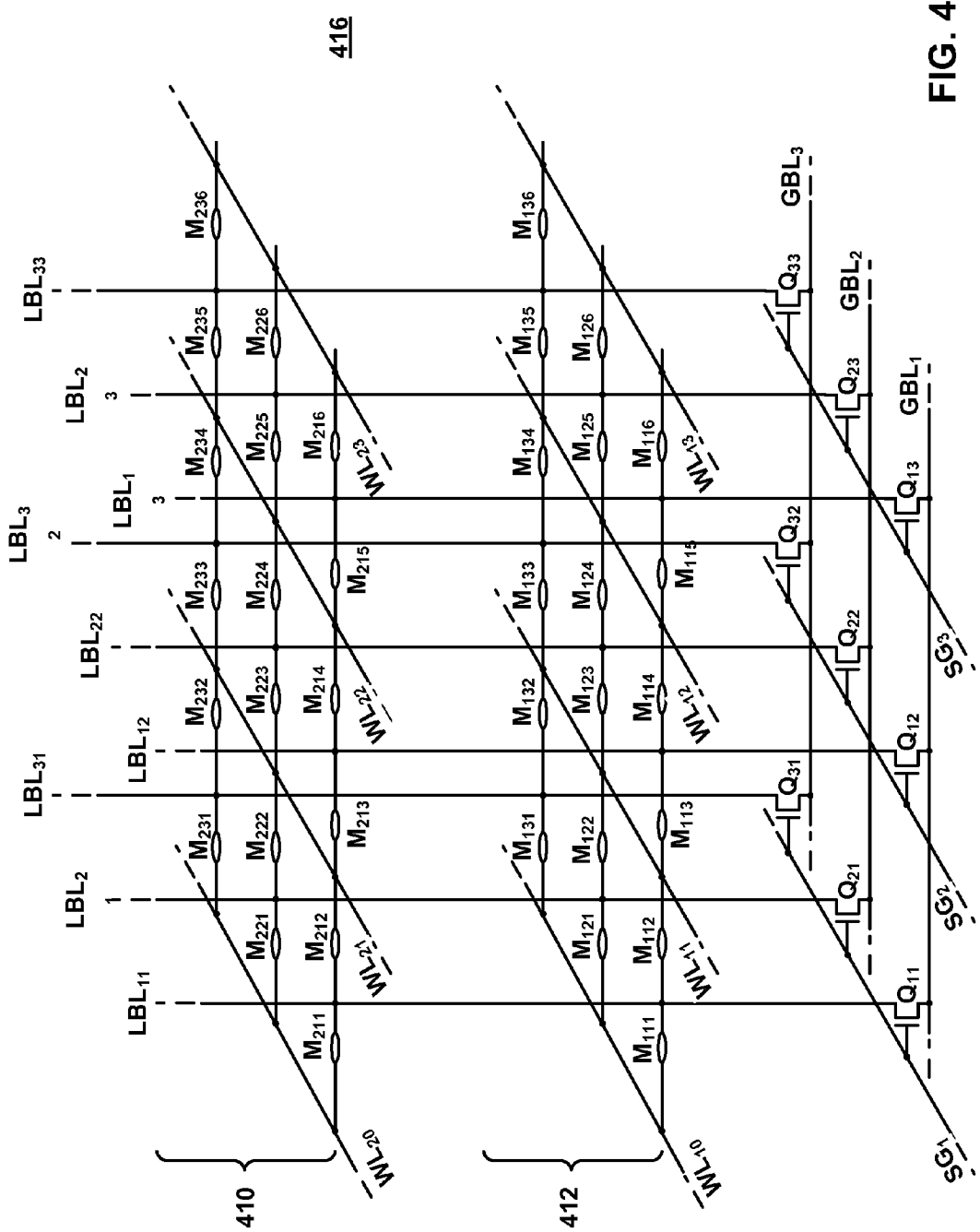
FIG. 4A depicts an embodiment of a portion of a monolithic three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate device or a charge trap device (e.g., using a silicon nitride material). The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
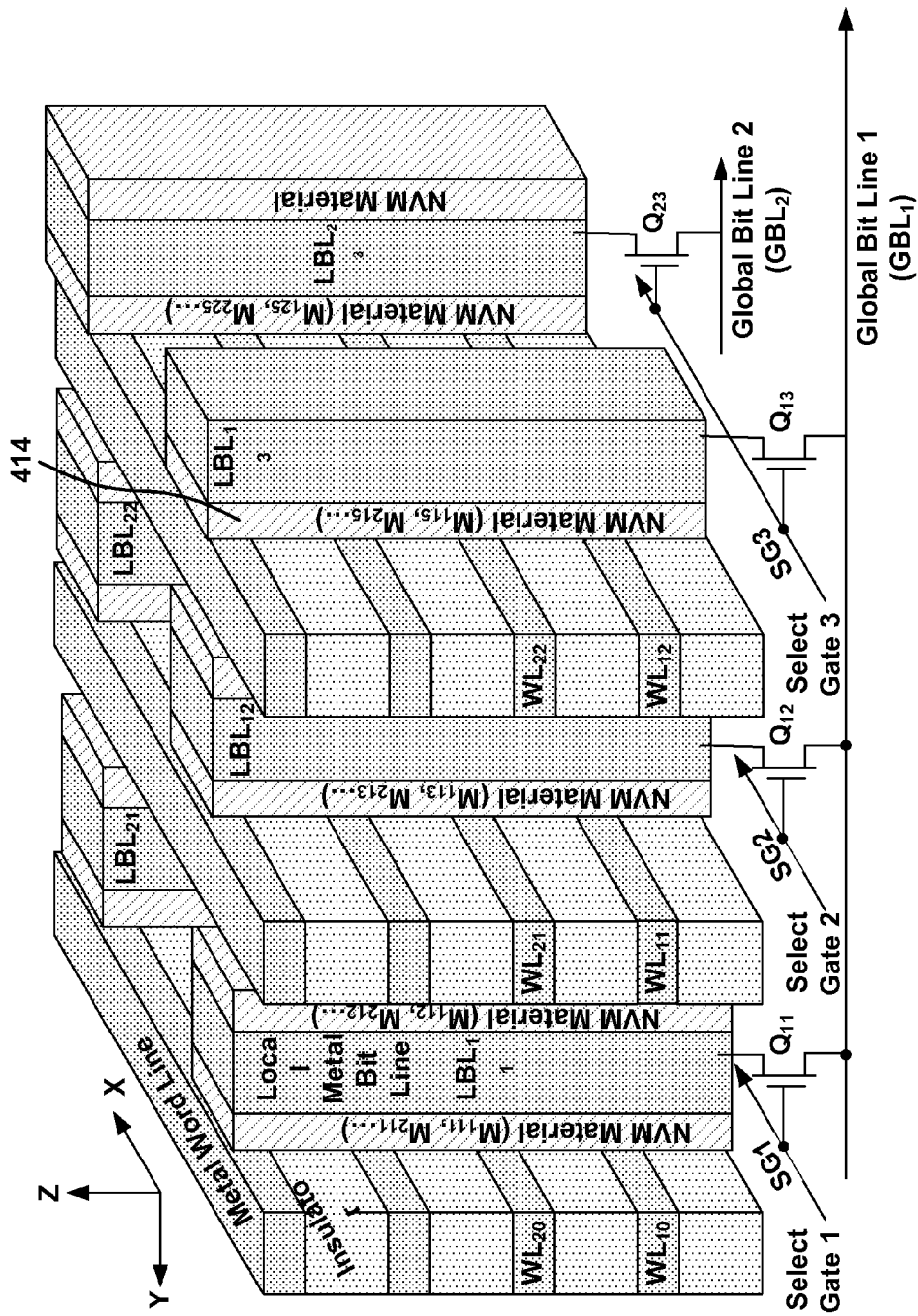
FIG. 4B depicts an embodiment of a portion of a monolithic three-dimensional memory array that includes vertical strips of a non-volatile memory material.

FIG. 4B depicts one embodiment of a portion of a monolithic three-dimensional memory array that includes vertical strips of a non-volatile memory material. The physical structure depicted in FIG. 4B may include one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may include a single continuous layer of material that may be used by a plurality of memory cells or devices. In one example, portions of the vertical strip of the non-volatile memory material 414 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may include a MOS device (e.g., an NMOS device) or a vertical TFT.

Figure 5A:
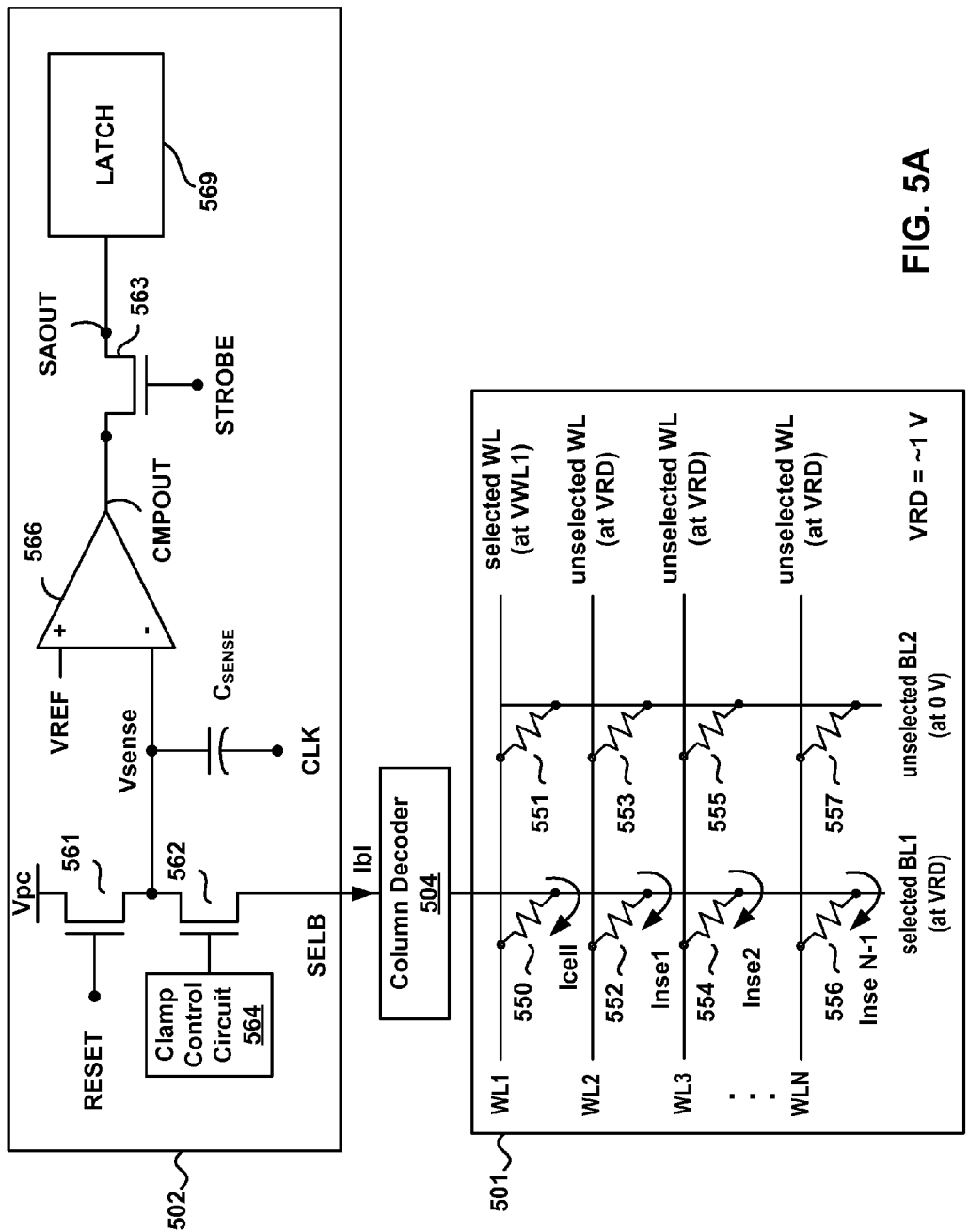
FIG. 5A depicts an embodiment of a sense amplifier and a portion of a memory array.

FIG. 5A depicts an embodiment of a sense amplifier 502 and a portion of a memory array 501. Sense amplifier 502 is an example of a portion of read/write circuit 306 in FIG. 1D. The portion of a memory array 501 includes two of the many bit lines (one selected bit line labeled "Selected BL" and one unselected bit line labeled "Unselected BL") and word lines (one selected word line WL1 labeled "Selected WL" and unselected word lines WL2, . . . , WLN labeled "Unselected WL"). The portion of a memory array also includes a selected memory cell 550 and unselected memory cells 551-557. In one embodiment, the portion of a memory array 501 may include a memory array with bit lines arranged in a direction horizontal to the substrate, such as memory array 201 in FIG. 3A. In another embodiment, the portion of a memory array 501 may include a memory array with bit lines arranged in a vertical direction that is perpendicular to the substrate, such as memory array 416 in FIG. 4A.

As depicted, during a memory array operation (e.g., a read operation), the selected bit line may be biased to VRD (~1V), the unselected word line may be biased to VRD, the selected word line may be biased to VWL1, and the unselected bit line may be biased to 0 V. In this case, unselected memory cells (e.g., 551) sharing the selected word line will be biased to the voltage difference between the selected word line voltage (0V) and the unselected bit line voltage (0 V). In addition, unselected memory cells (e.g., 552, 554, . . . , 556) sharing the selected bit line will be biased to the voltage difference between the unselected word line voltage (VRD=~1 V) and the selected bit line voltage (VRD=~1V). In other embodiments, the memory array biasing scheme depicted in FIG. 5A may be reversed such that the selected bit line is biased to 0 V, the unselected word line is biased to 0 V, the selected word line is biased to VRD, and the unselected bit line is biased to VRD.

As depicted, input terminal SELB of sense amplifier 502 may be electrically coupled to the selected bit line via column decoder 504. In one embodiment, column decoder 504 may correspond with column decoder 302 depicted in FIG. 1E. Transistor 562 couples (or electrically connects) input terminal SELB to the Vsense node. Transistor 562 may include a low VT nMOS device. Clamp control circuit 564 controls the gate of transistor 562.

The Vsense node is connected to transistor 561, a top plate of sense capacitor Csense, and one input node (e.g., an inverting input node) of comparator 566. The bottom plate of capacitor Csense is coupled to a clock signal CLK. The other input node (e.g., a non-inverting input node) of comparator 566 receives reference voltage VREF, which is the voltage level used for comparing the Vsense node voltage. A gate node of transistor 561 is a control signal node coupled to a reset signal RESET.

The output node CMPOUT of comparator 566 is coupled to a first node of a sampling transistor 563, which has a second node coupled to an output terminal SAOUT of sense amplifier 502, and a gate node that is coupled to a strobe signal STROBE. Output terminal SAOUT is coupled to a data latch 569. Each time strobe signal STROBE pulses HIGH, sampling transistor 563 turns ON, and the output node CMPOUT of comparator 566 is coupled to data latch 569.

Figure 5B:
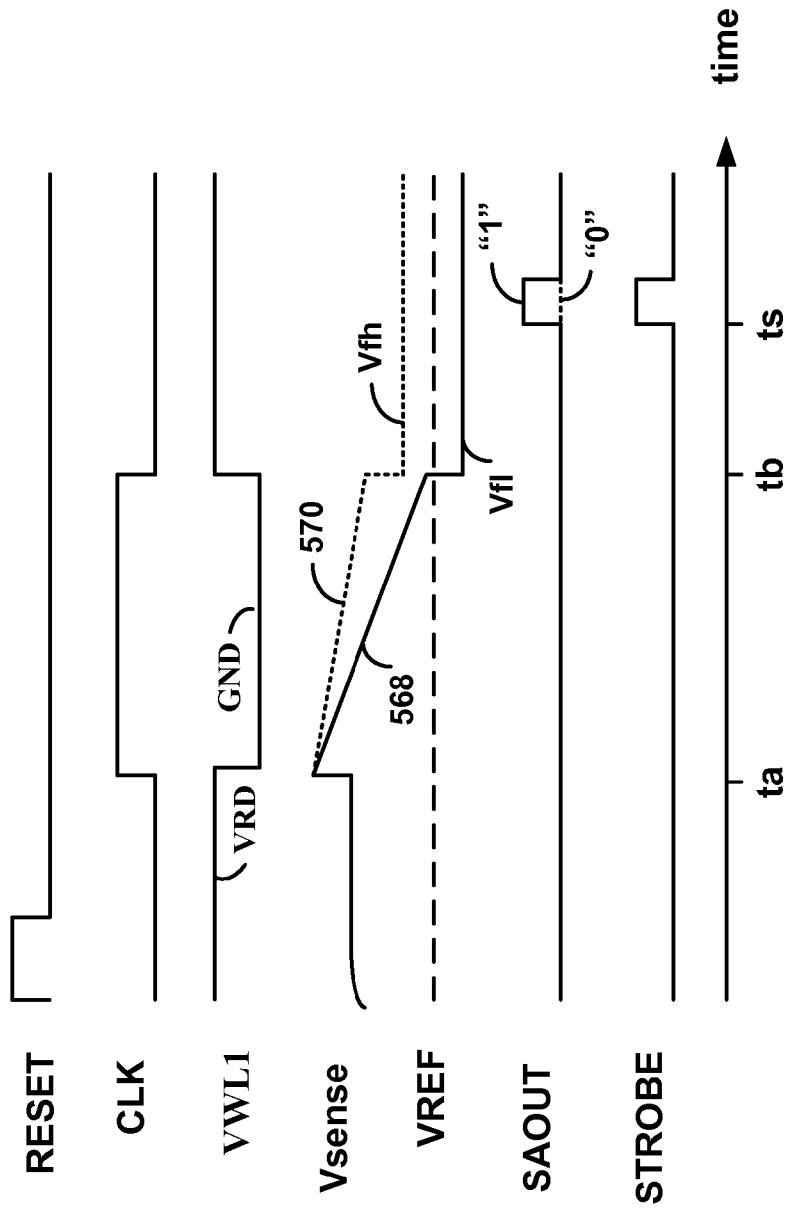
FIG. 5B depicts an example timing diagram of various signals for the embodiment of FIG. 5A.

Referring to FIGS. 5A and 5B, in an embodiment, during a read operation, sense amplifier 502 biases the selected bit line to the selected bit line voltage in read mode. Prior to sensing data, RESET signal turns transistor 561 ON, and pre-charges the Vsense node to Vpc (e.g., ~3 V). When sensing data, sense amplifier 502 attempts to regulate input terminal SELB to the selected bit line voltage (e.g., ~1V) via clamp control circuit 564 and transistor 562 in a source-follower configuration. Other values may be used for Vpc.

At time ta, clock signal CLK goes HIGH, boosting the Vsense node voltage, and VWL1 is pulled to GND (e.g., 0 V), causing cell current Icell to flow through selected memory cell 550 and selected bit line BL1. Because RESET is LOW, transistor 561 is OFF, and the only path for the selected bit line current Ib1 is through sense capacitor Csense. Thus, the selected bit line current Ib1 begins to discharge sense capacitor Csense, at a rate determined by the resistance of the selected memory cell 550.

If the selected memory cell 550 is in a low resistance state (e.g., a SET state), cell current Icell=Icell$_L$, and the selected bit line current Ib1 will discharge sense capacitor Csense as shown in trace 568. In contrast, if the selected memory cell 550 is in a high resistance state (e.g., a RESET state), cell current Icell=Icell$_H$, and the selected bit line current Ib1 will discharge sense capacitor Csense at a lower rate, as shown in trace 570.

At time tb, clock signal CLK goes LOW, pulling the Vsense node low, and VWL1 is pulled to VRD. In addition, clamp control circuit 564 puts transistor 562 in a high resistance state. Thus, the Vsense node voltage on capacitor Csense remains constant at a final value Vfl (if the selected memory cell 550 is in a low resistance state) or Vfh (if the selected memory cell 550 is in a high resistance state).

The change in voltage of capacitor Csense during the sensing interval (tb–ta) is the cell voltage, Vcell:

$$Vcell_H = \frac{Icell_H}{Csense}\Delta t$$

$$Vcell_L = \frac{Icell_L}{Csense}\Delta t$$

where Vcell$_H$ is the cell voltage if the selected memory cell 550 is in a high resistance state, and Vcell$_L$ is the cell voltage if the selected memory cell 550 is in a low resistance state.

At time ts, strobe signal STROBE goes HIGH, coupling the output node CMPOUT of comparator 566 to data latch 569. If the Vsense node voltage has a final value Vfl, the Vsense node voltage is lower than reference voltage VREF, and SAOUT is HIGH, which is stored as a value of data "1" in data latch 569. In contrast, if the Vsense node voltage has a final value Vfh, the Vsense node voltage is higher than reference voltage VREF, and SAOUT is LOW, which is stored as a value of data "0" in data latch 569. Outputting a data "0" represents that the selected memory cell 550 is in a high resistance state, and outputting a data "1" represents that the selected memory cell 550 is in a low resistance state. Data latch 569 latches the strobed output SAOUT.

The sensing margin ΔV=(Vfh–Vfl) may be expressed as:

$$\Delta V = \frac{\Delta Icell \times \Delta t}{Csense}$$

where ΔIcell=(Icell$_L$–Icell$_H$) is the difference in cell current between an OFF cell and an ON cell. To reliably distinguish between an OFF cell and an ON cell, the sensing margin ΔV should be as large as possible.

Referring again to FIG. 5A, during the sensing interval Δt, while cell current Icell flows through selected memory cell 550, noise currents Inse1, Inse2, . . . , InseN–1 flow through unselected memory cells (e.g., 552, 554, . . . , 556) sharing the selected bit line BL1. That is, although these unselected memory cells are biased to the voltage difference between the unselected word line voltage (VRD=~1 V) and the selected bit line voltage (VRD=~1V), a small noise current may flow through each of unselected memory cells (e.g., 552, 554, . . . , 558) sharing the selected bit line BL1.

Thus, during the sensing interval Δt, the selected bit line current Ib1 includes not only the cell current Icell of selected memory cell 550, but also includes the total noise current Inoise=Inse1+Inse2+ . . . +InseN−1:

$$Ib1 = Icell + Inoise$$

As a result, the cell voltages include a noise component:

$$\hat{V}cell_H = Vcell_H + Vnoise$$

$$\hat{V}cell_L = Vcell_L + Vnoise$$

where Vnoise is a noise voltage on the Vsense node resulting from noise current Inoise:

$$Vnoise = \frac{Inoise}{Csense} \Delta t$$

Depending on the resistance state of selected memory cell 550, ΔIcell may be about 30-40 nA. The total noise current Inoise, however, may be between about 10-20 nA, and thus may significantly diminish the ability to reliably distinguish between a memory cell in a low resistance state and a high resistance state. Some previously known techniques have been used to try to cancel the total noise current Inoise. However, such techniques have reduced sensing margin ΔV, which limits the ability to reliably distinguish between OFF cells and ON cells.

Figure 6A:
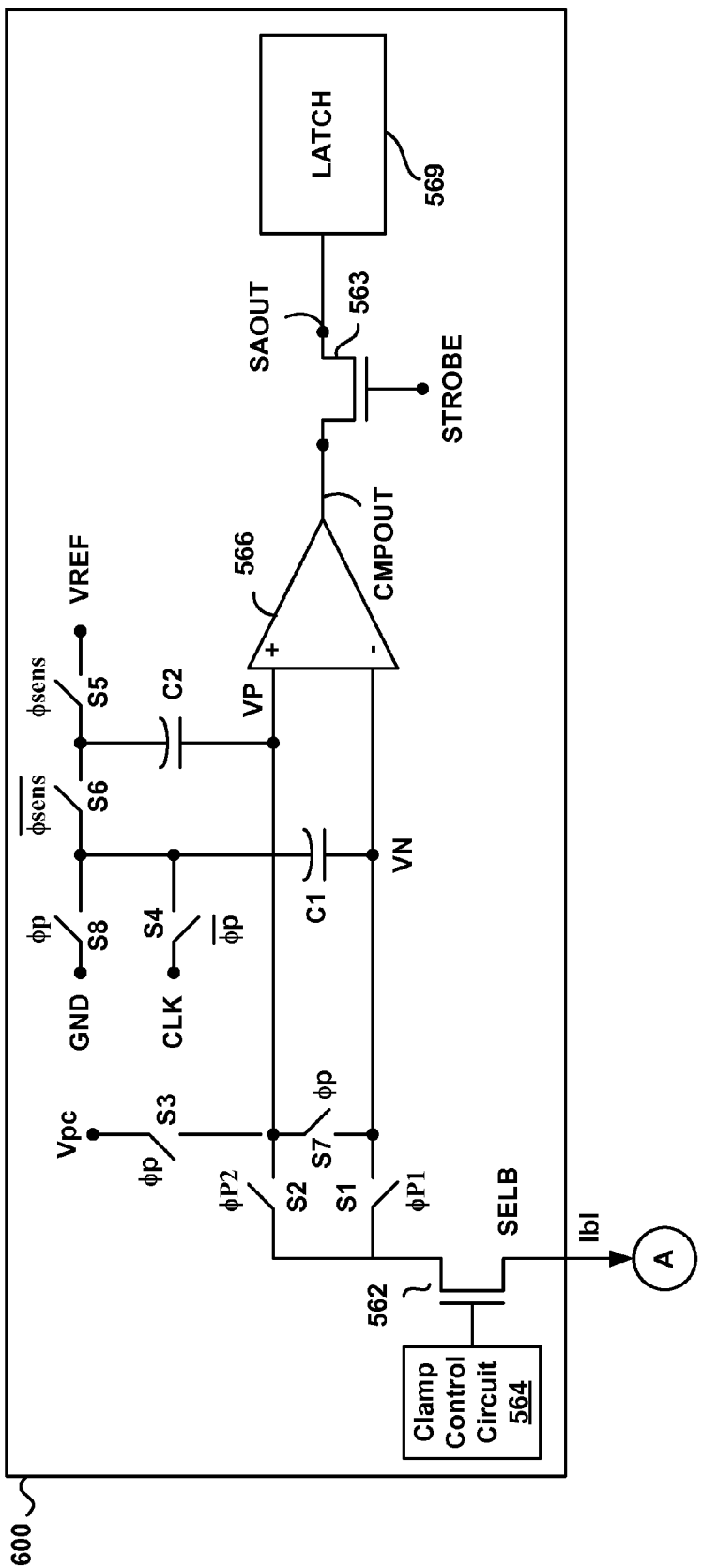
FIG. 6A is another embodiment of a sense amplifier.
Figure 6C:
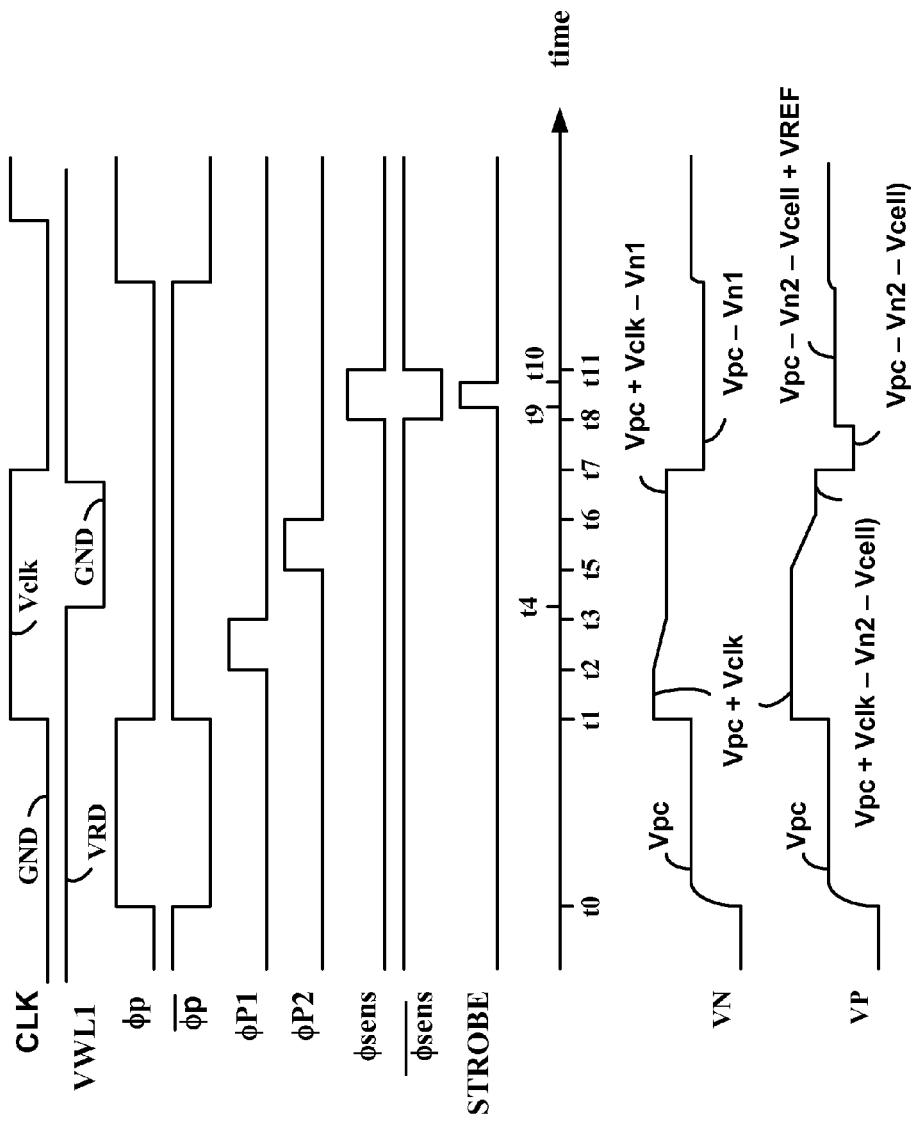
FIG. 6C is an example timing diagram of various signals for the embodiment of FIGS. 6A and 6B1-6B2.

FIGS. 6A-6C depict an embodiment of a two-capacitor sense amplifier 600 and the portion of a memory array 501. Sense amplifier 600 is an example of a portion of read/write circuit 306 in FIG. 1D. Sense amplifier 600 includes input terminal SELB, output terminal SAOUT, a reference terminal coupled to reference voltage VREF, a pre-charge input terminal coupled to a pre-charge voltage Vpc, and a clock terminal coupled to clock signal CLK. Sense amplifier 600 also includes a first capacitor C1 having a first terminal VN coupled to a first input terminal (e.g., an inverting input terminal) of comparator 566, and a second capacitor C2 having a first terminal VP coupled to a second input terminal (e.g., a non-inverting input terminal) of comparator 566.

First capacitor C1 and second capacitor C2 have substantially equal capacitor values. For example, first capacitor C1 has a first capacitor value C1V and second capacitor has a second capacitor value C2V, and first capacitor value C1V and second capacitor value C2V are equal within a predetermined capacitor matching accuracy Cmat. For example, C1V and C2V may be between about 15 fF and about 25 fF, and Cmat may be between about 1% and about 3%. Other capacitor values and matching accuracies may be used.

A first switch S1 controlled by a first control signal φP1 is coupled between input terminal SELB and first terminal VN of first capacitor C1. A second switch S2 controlled by a second control signal φP2 is coupled between input terminal SELB and first terminal VP of second capacitor C2. A third switch S3 controlled by a third control signal φp is coupled between pre-charge input terminal Vpc and first terminal VN of first capacitor C1 and first terminal VP of second capacitor C2. A fourth switch S4 controlled by a fourth control signal $\overline{\phi p}$ that is an inverse of third control signal φp is coupled between clock terminal CLK and a second terminal of first capacitor C1 and a second terminal of second capacitor C2. A fifth switch S5 controlled by a fifth control signal φsense is coupled between reference terminal VREF and second terminal of second capacitor C2. A sixth switch S6 controlled by a sixth control signal $\overline{\phi sense}$ that is an inverse of fifth control signal φsense is coupled between the second terminal of second capacitor C2 and fourth switch S4. A seventh switch S7 controlled by third control signal φp is coupled between first terminal VN of first capacitor C1 and first terminal VP of second capacitor C2. An eighth switch S8 controlled by third control signal φp is coupled between sixth switch S6 and a GND terminal. Persons of ordinary skill in the art will understand that more or less than eight switches may be used in sense amplifier 600.

During a read operation, sense amplifier 600 biases the selected bit line to the selected bit line voltage in read mode. When sensing data, sense amplifier 600 attempts to regulate input terminal SELB to the selected bit line voltage VRD (e.g., ~1V) via clamp control circuit 564 and transistor 562 in a source-follower configuration.

As depicted in FIGS. 6B1 and 6C, prior to time t0, clock signal CLK is at GND, the selected word line WL1 and the selected bit line BL1 are both biased at VRD (~1V), first control signal φP1, second control signal φP2, third control signal φp, fifth control signal φsense and STROBE are all LOW, fourth control $\overline{\phi p}$ and sixth control signal $\overline{\phi sense}$ are all HIGH, switches S4 and S6 are closed, and the second terminals of first capacitor C1 and second capacitor C2 are both connected to clock signal CLK.

At time t0, third control signal φp goes HIGH, and fourth control $\overline{\phi p}$ goes LOW, closing switches S3, S7 and S8, opening switch S4, and connecting first terminal VN of first capacitor C1 and first terminal VP of second capacitor C2 to pre-charge terminal Vpc, and the second terminals of first capacitor C1 and second capacitor C2 to GND. As depicted in FIG. 6C, first terminal VN of first capacitor C1 and first terminal VP of second capacitor C2 begin to charge to VPC, which may be between about 3 V and about 3.5 V.

By time t1, first terminal VN of first capacitor C1 and first terminal VP of second capacitor C2 are fully charged to pre-charge voltage VPC. At t1, third control signal $\phi_p$ goes LOW, and fourth control $\overline{\phi p}$ goes HIGH, opening switches S3, S7 and S8, and closing switch S4. Second terminals of first capacitor C1 and second capacitor C2 are coupled to clock signal CLK, which goes to a high potential of Vclk. Because the voltage across a capacitor cannot change instantaneously, first terminal VN of first capacitor C1 and first terminal VP of second capacitor C2 each increase to Vpc+Vclk.

As depicted in FIGS. 6A, 6B1 and 6C, during a first sense interval Δt1=t2−t3, first control signal φP1 goes HIGH, and switch S1 closes, connecting first terminal VN of first capacitor C1 to input terminal SELB of sense amplifier 600. Switches S2, S3, S5, S7 and S8 are open, switches S1, S4 and S6 are closed, and the only path for the selected bit line current Ib1 is through first capacitor C1. Selected bit line BL1 conducts a first selected bit line current Ibl1, which begins to discharge first capacitor C1 at a rate determined by the resistance of the selected memory cell 550. During the first sense interval, selected bit line current Ibl1 is a sum of noise currents conducted by memory cells 550, 552, 554, . . . , 556:

$$Ibl1 = Inse0 + Inse1 + Inse2 + \ldots + InseN-1 = Inf$$

which is referred to herein as a first noise current Inf of memory array 501. Thus, sense amplifier 600 integrates first selected bit line current Ibl1 on first capacitor C1 for first sense interval Δt1, generating a first voltage Vn1 on first capacitor C1 proportional to the first noise current of memory array 501:

$$Vn1 = \frac{\Delta t1}{C1} \times Inf$$

At time t3, first control signal φP1 goes LOW and switch S1 opens, disconnecting first terminal VN of first capacitor C1 from input terminal SELB of sense amplifier 600. As a result, the voltage of first terminal VN of first capacitor C1 is:

*VN*=Vpc+Vclk−*Vn*1

At time t4, VWL1 goes to 0V. As depicted in FIGS. 6A, 6B2 and 6C, during a second sense interval Δt2=t5−t6, second control signal φP2 goes HIGH, and switch S2 closes, connecting first terminal VP of second capacitor C2 to input terminal SELB of sense amplifier 600. Switches S1, S3, S5, S7 and S8 are open, switches S2, S4 and S6 are closed, and the only path for the selected bit line current Ibl is through second capacitor C2. Selected bit line BL1 conducts a second selected bit line current Ibl2, which begins to discharge second capacitor C2 at a rate determined by the resistance of the selected memory cell 550. During the second sense interval, selected bit line current Ibl2 is a sum of a current Icell of selected memory cell 550 and noise currents conducted by memory cells 552, 554, . . . , 556:

Ibl2=*I*cell+Inse1+Inse2+ . . . +Inse*N*−1=Icell+Ins wherein Ins is referred to herein as a second noise current of memory array 501 and is an estimate of first noise current Inf. Thus, sense amplifier 600 integrates second selected bit line current Ibl2 on second capacitor C2 for second sense interval Δt2, generating a second voltage Vcell on second capacitor C2 proportional to cell current Icell, and a third voltage Vn2 on second capacitor C2 proportional to the second noise current of memory array 501:

$$Vcell = \frac{\Delta t2}{C2} \times Icell$$

$$Vn2 = \frac{\Delta t2}{C2} \times Ins$$

At time t6, second control signal φP2 goes LOW and switch S2 opens, disconnecting first terminal VP of second capacitor C2 from input terminal SELB of sense amplifier 600. As a result, the voltage of first terminal VP of second capacitor C2 is:

*VP*=Vpc+Vclk−*Vn*2−*V*cell

At time t7, clock signal CLK goes to GND. Because the voltage across a capacitor cannot change instantaneously, first terminal VN of first capacitor C1 and first terminal VP of second capacitor C2 each decrease by Vclk:

*VN*=Vpc−*Vn*1

*VP*=Vpc−*Vn*2−*V*cell

At time t8, fifth control signal φsense goes HIGH and sixth control signal $\overline{\phi}$ sense goes LOW, closing switch S5 and opening switch S6, connecting the second terminal of second capacitor C2 to reference voltage terminal VREF. Because the voltage across a capacitor cannot change instantaneously, first terminal VP of second capacitor C2 increases by VREF:

*VP*=Vpc−*Vn*2−*V*cell+*V*REF

Comparator 566 generates an output voltage CMPOUT proportional to a difference between a voltage VP on the second input terminal of comparator 566 and a voltage VN on the first input terminal of comparator 566:

$$CMPOUT =$$
$$A \times (VP - VN) = A \times (Vpc - Vn2 - Vcell + VREF) - (Vpc - Vn1) =$$
$$A \times [(VREF - Vcell) + (Vn1 - Vn2)]$$

where A is the gain of comparator 566. Thus, comparator 566 generates an output voltage CMPOUT that is proportional to a difference between reference voltage VREF and second voltage Vcell, and a difference between first voltage Vn1 and third voltage Vn2.

From the equations above, if C1 equals C2, Δt1 equals Δt2, and if first noise current Inf equals second noise current Ins, first voltage Vn1 equals third voltage Vn2, and comparator output CMPOUT is:

CMPOUT=*A*×(*V*REF−*V*cell)

and thus the noise components of unselected memory cells coupled to the selected bit line BL1 have been removed.

As a result of manufacturing variations and other variable, C1 may not exactly equal C2, Δt1 may not exactly equal Δt2, first noise current Inf may not exactly equal second noise current Ins, and as a result, first voltage Vn1 may not exactly equal third voltage Vn2, Thus, comparator 566 output CMPOUT may be expressed as:

CMPOUT=*A*×(*V*REF−*V*cell)+err where err is an error resulting to mismatches. Without wanting to be bound by any particular theory, it is believed that if C1 and C2 match within about 3%, Δt1 and Δt2 match within about 10%, and first noise current Inf and second noise current Ins match within about 10%, err will be on the order of about 5%, and CMPOUT may reliably be used to determine a data value of selected memory cell 550.

Output node CMPOUT of comparator 566 is coupled to a first node of a sampling transistor 563, which has a second node coupled to output terminal SAOUT of sense amplifier 600, and a gate node that is coupled to a strobe signal STROBE. Output terminal SAOUT is coupled to a data latch 569. Each time strobe signal STROBE pulses HIGH, sampling transistor 563 turns ON, and output CMPOUT of comparator 566 is coupled to data latch 569.

Referring again to FIG. 6C, at time t9, STROBE goes HIGH, and thus output CMPOUT of comparator 566 is coupled to data latch 569, determining a data value for selected memory cell 550.

Figure 7:
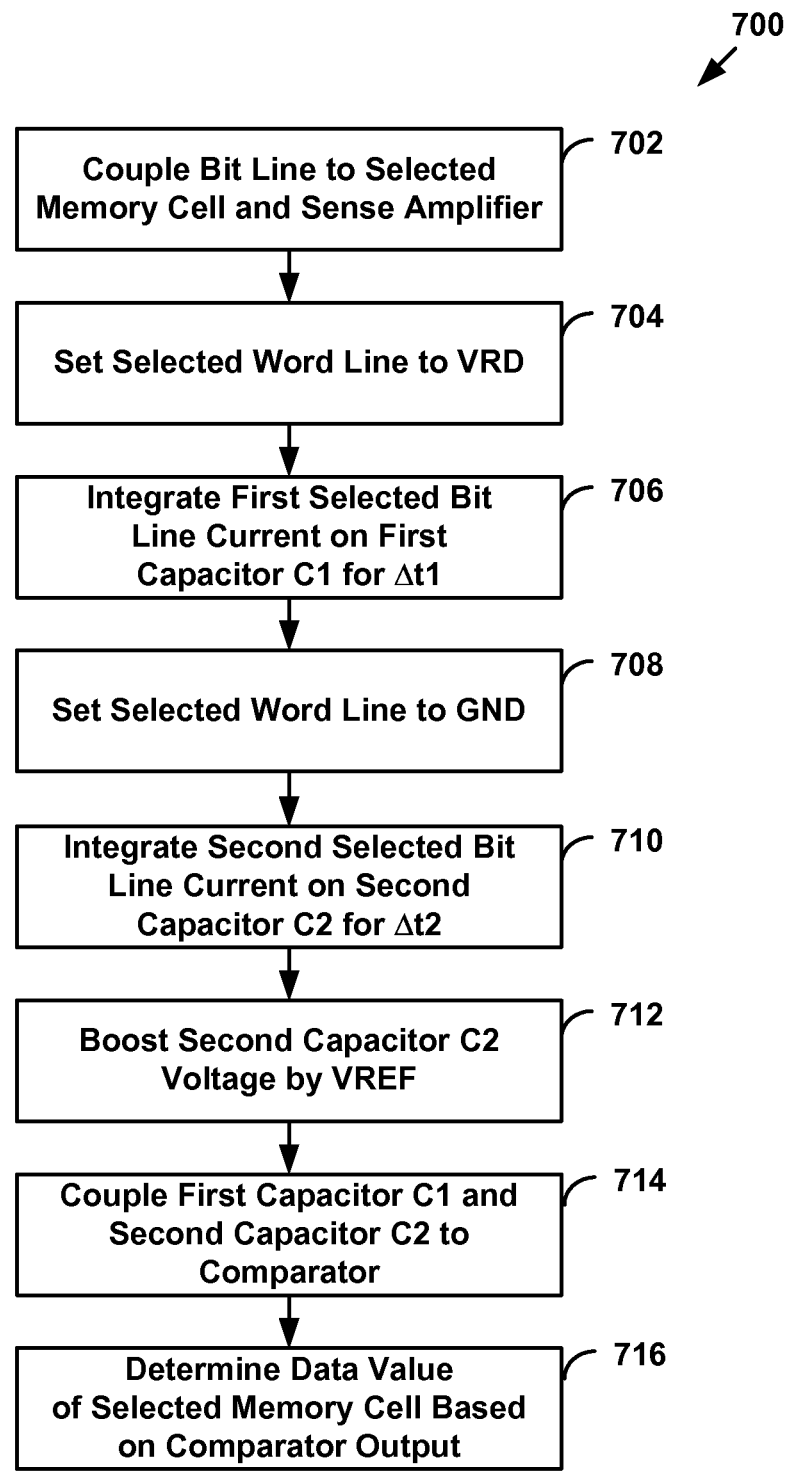
FIG. 7 is a flow diagram of a method embodiment.

FIG. 7 depicts an embodiment of a method 700 of the disclosed technology. In particular at step 702, a bit line (e.g., BL1 of FIG. 6B1) is coupled to a selected memory cell (e.g., memory cell 550 of FIG. 6B1) and a sense amplifier (e.g., sense amplifier 600 of FIG. 6A) that includes a first capacitor C1 and a second capacitor C2. At step 704, a selected word line (e.g., WL1 of FIG. 6B1) is set to read voltage VRD. At step 706, a first selected bit line current is integrated on first capacitor C1 for a first sense interval Δt1. At step 708, the selected word line is set to GND (e.g., as depicted in FIG. 6B2). At step 710, a second selected bit line current is integrated on second capacitor C2 for a second sense interval Δt2. At step 712, a voltage of second capacitor C2 is boosted by reference voltage VREF. At step 714, first capacitor C1 and second capacitor C2 are coupled to input terminals of a comparator (e.g., comparator 566 of FIG. 6A). At step 716, the output of the comparator is used to determine a data value of the selected memory cell.

Figure 8:
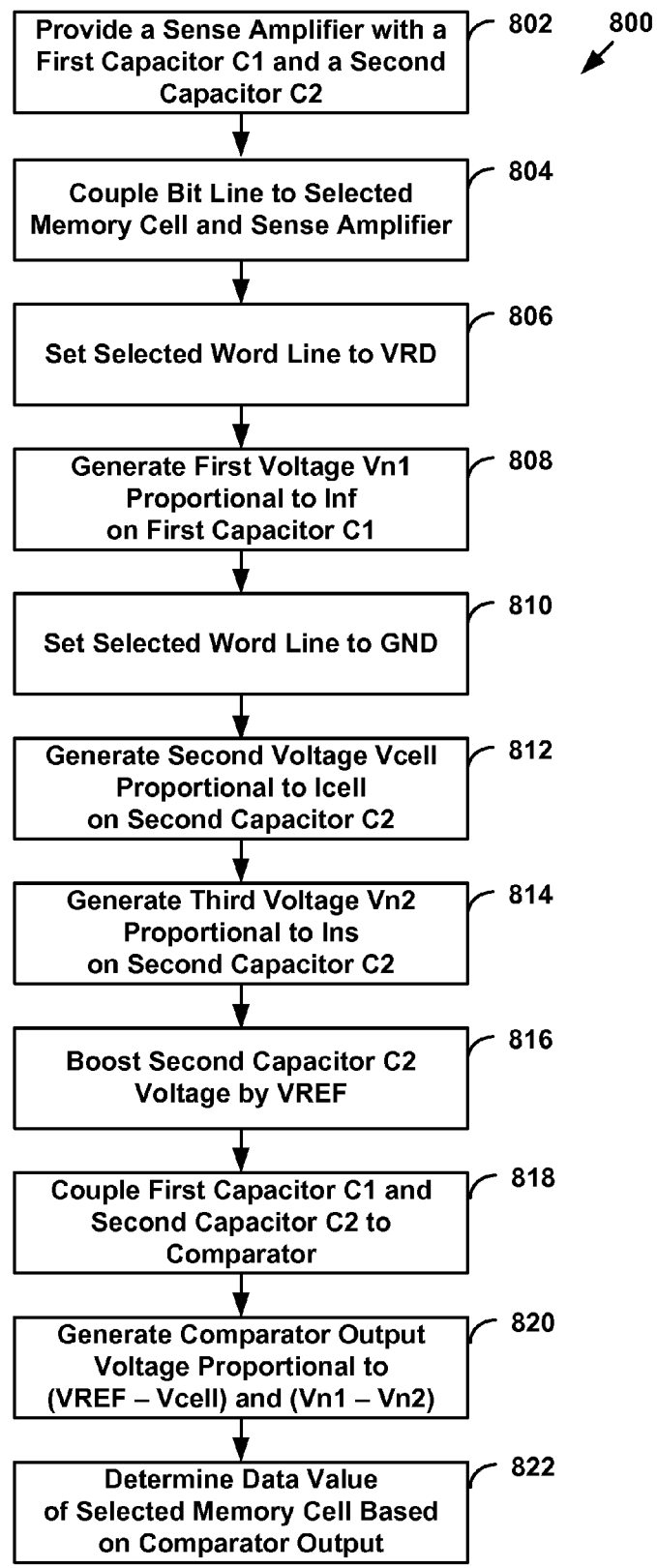
FIG. 8 is a flow diagram of another method embodiment

FIG. 8 depicts an embodiment of a method 800 of the disclosed technology. In particular at step 802, a sense amplifier (e.g., sense amplifier 600 of FIG. 6A) is provided that includes a first capacitor C1 and a second capacitor C2. At step 804, a bit line (e.g., BL1 of FIG. 6B1) is coupled to a selected memory cell (e.g., memory cell 550 of FIG. 6B1) and the sense amplifier. At step 806, a selected word line (e.g., WL1 of FIG. 6B1) is set to read voltage VRD. At step 808, a first voltage Vn1 proportional to first noise current Ins is generated on first capacitor C1. At step 810, the selected word line is set to GND (e.g., as depicted in FIG. 6B2). At step 812, a second voltage Vcell proportional to the cell current Icell of the selected memory cell is generated on second capacitor C2. At step 814, a third voltage Vn2 proportional to second noise current Ins is generated on second capacitor C2. At step 816, a voltage of second capacitor C2 is boosted by reference voltage VREF. At step 818, first capacitor C1 and second capacitor C2 are coupled to input terminals of a comparator (e.g., comparator 566 of FIG. 6A). At step 820, a comparator output voltage is generated that is proportional to a difference between reference voltage VREF and second voltage Vcell and a difference between first voltage Vn1 and third voltage Vn2. At step 822, the output of the comparator is used to determine a data value of the selected memory cell.

One embodiment of the disclosed technology includes a method for use with a memory array that includes a selected memory cell and a plurality of unselected memory cells. The selected memory cell is coupled to a selected word line and a selected bit line, and each unselected memory cell is coupled to the selected bit line and a corresponding one of a plurality of unselected word lines. The bit line is biased at a selected bit line voltage, and each unselected word line is biased at an unselected word line voltage. The method includes integrating a first selected bit line current on a first capacitor of a sense amplifier for a first sense interval, the first selected bit line current including a first noise current of the memory array, and integrating a second selected bit line current on a second capacitor of the sense amplifier for a second sense interval, the second selected bit line current including a sum of a current conducted by the selected memory cell and a second noise current of the memory array.

One embodiment of the disclosed technology includes a a sense amplifier for use with a memory array that includes a selected memory cell and a plurality of unselected memory cells. The selected memory cell is coupled to a selected word line and a selected bit line, and each unselected memory cell is coupled to the selected bit line and a corresponding one of a plurality of unselected word lines. The bit line is biased at a selected bit line voltage, and each unselected word line is biased at an unselected word line voltage. The sense amplifier includes an input terminal coupled to the selected bit line, an output terminal, a reference terminal and a clock terminal, a comparator that includes a first input terminal, a second input terminal, and an output terminal coupled to the output terminal of the sense amplifier, a first capacitor that includes a first terminal coupled to the input terminal of the sense amplifier and the first input terminal of the comparator, and a second terminal coupled to the clock terminal, and a second capacitor that includes a first terminal coupled to the input terminal of the sense amplifier and the second input terminal of the comparator, and a second terminal coupled to the reference terminal.

One embodiment of the disclosed technology includes a method for determining a data value of a selected memory cell of a memory array. The selected memory cell is coupled to a selected word line and a selected bit line. The memory array further includes a plurality of unselected memory cells, each unselected memory cell coupled to the selected bit line and a corresponding one of a plurality of unselected word lines. The bit line is biased at a selected bit line voltage, and each unselected word line is biased at an unselected word line voltage. The method includes providing a sense amplifier comprising a first capacitor, a second capacitor, a reference terminal coupled to a reference voltage, and an output terminal, generating a first voltage on the first capacitor proportional to a first noise current in the memory array, generating a second voltage on the second capacitor proportional to a current conducted by the selected memory cell, generating a third voltage on the second capacitor proportional to a second noise current in the memory array, generating an output voltage at the output terminal, wherein the output voltage is proportional to a difference between the reference voltage and the second voltage and a difference between the first voltage and the third voltage, and determining the data value based on the output voltage.

One embodiment of the disclosed technology includes a method for use with a memory array that includes a selected memory cell and a plurality of unselected memory cells. The selected memory cell is coupled to a selected word line and a selected bit line, and each unselected memory cell is coupled to the selected bit line and a corresponding one of a plurality of unselected word lines. The bit line is biased at a selected bit line voltage, and each unselected word line is biased at an unselected word line voltage. The method includes providing a sense amplifier that includes an input terminal coupled to the selected bit line, an output terminal, a reference terminal and a clock terminal, a comparator that includes a first input terminal, a second input terminal, and an output terminal coupled to the output terminal of the sense amplifier, a first capacitor that includes a first terminal coupled to the input terminal of the sense amplifier and the first terminal of the comparator, and a second terminal coupled to the clock terminal, and a second capacitor that includes a first terminal coupled to the input terminal of the sense amplifier and the second terminal of the comparator, and a second terminal coupled to the reference terminal.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method for use with a memory array comprising a selected memory cell and a plurality of unselected memory cells, the selected memory cell coupled to a selected word line and a selected bit line, each unselected memory cell coupled to the selected bit line and a corresponding one of a plurality of unselected word lines, the selected bit line biased at a selected bit line voltage, each unselected word line biased at an unselected word line voltage, the method comprising:
  integrating a first selected bit line current on a first capacitor of a sense amplifier for a first sense interval, the first selected bit line current comprising a first noise current of the memory array; and
  integrating a second selected bit line current on a second capacitor of the sense amplifier for a second sense interval, the second selected bit line current comprising a sum of a current conducted by the selected memory cell and a second noise current of the memory array.

2. The method of claim 1, wherein the first capacitor has a first capacitor value and the second capacitor has a second capacitor value, and the first capacitor value and the second capacitor value are equal within a predetermined capacitor matching accuracy.

3. The method of claim 1, wherein the first noise current comprises an estimate of the second noise current.

4. The method of claim 1, wherein the first sense interval substantially equals the second sense interval.

5. The method of claim 1, wherein the selected memory cell and the unselected memory cells each comprise a reversible resistance-switching element.

6. A sense amplifier for use with a memory array comprising a selected memory cell and a plurality of unselected memory cells, the selected memory cell coupled to a selected word line and a selected bit line, each unselected memory cell coupled to the selected bit line and a corresponding one of a plurality of unselected word lines, the selected bit line biased at a selected bit line voltage, each unselected word line biased at an unselected word line voltage, the sense amplifier comprising:
  an input terminal coupled to the selected bit line, an output terminal, a reference terminal and a clock terminal;
  a comparator comprising a first input terminal, a second input terminal, and an output terminal coupled to the output terminal of the sense amplifier;
  a first capacitor comprising a first terminal coupled to the input terminal of the sense amplifier and the first input terminal of the comparator, and a second terminal coupled to the clock terminal; and
  a second capacitor comprising a first terminal coupled to the input terminal of the sense amplifier and the second input terminal of the comparator, and a second terminal coupled to the reference terminal.

7. The sense amplifier of claim 6, wherein the first capacitor has a first capacitor value and the second capacitor has a second capacitor value, and the first capacitor value and the second capacitor value are equal within a predetermined capacitor matching accuracy.

8. The sense amplifier of claim 6, further comprising:
  a first switch coupled between the first terminal of the first capacitor and the input terminal of the sense amplifier; and
  a second switch coupled between the first terminal of the second capacitor and the input terminal of the sense amplifier.

9. The sense amplifier of claim 8, wherein:
  the first switch connects the first terminal of the first capacitor and the input terminal of the sense amplifier for a first sense interval; and
  the second switch connects the first terminal of the second capacitor and the input terminal of the sense amplifier for a second sense interval,
  wherein the first sense interval substantially equals the second sense interval.

10. The sense amplifier of claim 6, further comprising:
  a pre-charge input terminal; and
  a third switch coupled between the pre-charge input terminal and the first terminal of the first capacitor and the first terminal of the second capacitor.

11. The sense amplifier of claim 6, further comprising a fourth switch coupled between the clock terminal and the second terminal of the first capacitor and the second terminal of the second capacitor.

12. The sense amplifier of claim 6, further comprising a fifth switch coupled between the second terminal of the second capacitor and the reference terminal.

13. A method for determining a data value of a selected memory cell of a memory array, the selected memory cell coupled to a selected word line and a selected bit line, the memory array further comprising a plurality of unselected memory cells, each unselected memory cell coupled to the selected bit line and a corresponding one of a plurality of unselected word lines, the selected bit line biased at a selected bit line voltage, each unselected word line biased at an unselected word line voltage, the method comprising:
  providing a sense amplifier comprising a first capacitor, a second capacitor, a reference terminal coupled to a reference voltage, and an output terminal;
  generating a first voltage on the first capacitor proportional to a first noise current in the memory array;
  generating a second voltage on the second capacitor proportional to a current conducted by the selected memory cell;
  generating a third voltage on the second capacitor proportional to a second noise current in the memory array;
  generating an output voltage at the output terminal, wherein the output voltage is proportional to a difference between the reference voltage and the second voltage and a difference between the first voltage and the third voltage; and
  determining the data value based on the output voltage.

14. The method of claim 13, wherein the first capacitor has a first capacitor value and the second capacitor has a second capacitor value, and the first capacitor value and the second capacitor value are equal within a predetermined capacitor matching accuracy.

15. The method of claim 13, wherein the first voltage substantially equals the third voltage.

16. The method of claim 13, wherein generating the first voltage comprises:
  biasing the selected word line to the unselected word line voltage; and
  coupling the bit line to the first capacitor for a first sense interval.

17. The method of claim 13, wherein generating a second voltage and generating a third voltage comprises:
  biasing the selected word line to a selected word line voltage; and
  coupling the bit line to the second capacitor for a second sense interval.

18. The method of claim 13, wherein:
generating the first voltage comprises a first sense interval and generating the second voltage and generating a the third voltage comprises a second sense interval; and
the first sense interval substantially equals the second sense interval.

19. The method of claim 13, wherein generating the output voltage comprises:
coupling a first terminal of the first capacitor to a first input terminal of a comparator, and coupling a second terminal of the first capacitor to a ground potential;
coupling a first terminal of the second capacitor to a second terminal of the comparator, and coupling a second terminal of the second capacitor to the reference terminal; and
coupling an output of the comparator to the output terminal of the sense amplifier.

20. The method of claim 13, wherein the selected memory cell and the unselected memory cells each comprise a reversible resistance-switching element.

21. A method for use with a memory array comprising a selected memory cell and a plurality of unselected memory cells, the selected memory cell coupled to a selected word line and a selected bit line, each unselected memory cell coupled to the selected bit line and a corresponding one of a plurality of unselected word lines, the selected bit line biased at a selected bit line voltage, each unselected word line biased at an unselected word line voltage, the method comprising:
providing a sense amplifier comprising:
an input terminal coupled to the selected bit line, an output terminal, a reference terminal and a clock terminal;
a comparator comprising a first input terminal, a second input terminal, and an output terminal coupled to the output terminal of the sense amplifier;
a first capacitor comprising a first terminal coupled to the input terminal of the sense amplifier and the first terminal of the comparator, and a second terminal coupled to the clock terminal; and
a second capacitor comprising a first terminal coupled to the input terminal of the sense amplifier and the second terminal of the comparator, and a second terminal coupled to the reference terminal.

\* \* \* \* \*